US007952551B2

(12) United States Patent
Kawata

(10) Patent No.: US 7,952,551 B2
(45) Date of Patent: May 31, 2011

(54) ELECTRO-OPTICAL DEVICE AND ELECTRONIC APPARATUS INCLUDING SAME

(75) Inventor: Hirotaka Kawata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1025 days.

(21) Appl. No.: 11/753,978

(22) Filed: May 25, 2007

(65) Prior Publication Data

US 2008/0012812 A1 Jan. 17, 2008

(30) Foreign Application Priority Data

Jul. 11, 2006 (JP) ................................. 2006-190391

(51) Int. Cl.
*G09G 3/36* (2006.01)
(52) U.S. Cl. .......................................... 345/92; 345/90
(58) Field of Classification Search .................... 438/30, 438/149, 166, 738; 349/42, 143; 345/30, 345/149, 166, 77, 90, 92; 437/52
See application file for complete search history.

(56) References Cited

U.S. PATENT DOCUMENTS

| | | | | |
|---|---|---|---|---|
| 5,591,659 | A * | 1/1997 | Ema et al. ...................... | 438/241 |
| 6,451,708 | B1 * | 9/2002 | Ha ................................. | 438/738 |
| 7,268,843 | B2 * | 9/2007 | Kawata et al. ................. | 349/111 |
| 2003/0076452 | A1 * | 4/2003 | Kim et al. ...................... | 349/43 |
| 2003/0124755 | A1 * | 7/2003 | Yamanaka et al. ............. | 438/30 |
| 2004/0085497 | A1 * | 5/2004 | Kawata .......................... | 349/111 |
| 2005/0231657 | A1 * | 10/2005 | Zhang et al. ................... | 349/42 |
| 2005/0236661 | A1 * | 10/2005 | Matsui et al. .................. | 257/316 |
| 2006/0061526 | A1 * | 3/2006 | Shirasaki et al. ............... | 345/77 |
| 2006/0066512 | A1 * | 3/2006 | Afentakis et al. .............. | 345/55 |
| 2006/0068532 | A1 * | 3/2006 | Schuele et al. ................. | 438/149 |
| 2006/0175706 | A1 * | 8/2006 | Lee et al. ....................... | 257/763 |
| 2006/0238689 | A1 * | 10/2006 | Kim et al. ...................... | 349/143 |
| 2006/0240587 | A1 * | 10/2006 | Yang .............................. | 438/30 |
| 2006/0289871 | A1 * | 12/2006 | Yoon .............................. | 257/72 |
| 2007/0035677 | A1 * | 2/2007 | Yamazaki et al. .............. | 349/43 |
| 2007/0058100 | A1 * | 3/2007 | Ishii ............................... | 349/43 |

FOREIGN PATENT DOCUMENTS

JP A 2002-328617 11/2002

* cited by examiner

*Primary Examiner* — Quan-Zhen Wang
*Assistant Examiner* — Tony Davis
(74) *Attorney, Agent, or Firm* — Oliff & Berridge, PLC

(57) ABSTRACT

An electro-optical device includes a transistor, a data line, a pixel-potential-side capacitor electrode, a relay layer, an output line, a first and a second scanning line. The transistor includes a first and a second gate electrode. The data line is connected to the transistor via a first contact hole. The relay layer is formed from the same film as the data line, and connected to the pixel-potential-side capacitor electrode via a second contact hole. The output line is formed from the same film as the data line and allows the scan signal from a driving circuit to pass therethrough. The first scanning line is formed from the same film as the first gate electrode and connected to the output line via a third contact hole. The third contact hole is opened in the same process of opening the first contact hole. The second scanning line is formed from the same film as the second gate electrode and connected to the output line via a fourth contact hole. The fourth contact hole includes a first opening opened in the same process of opening the first contact hole and a second opening opened in the same process of opening the second contact hole. The first and the second opening overlap each other.

7 Claims, 12 Drawing Sheets

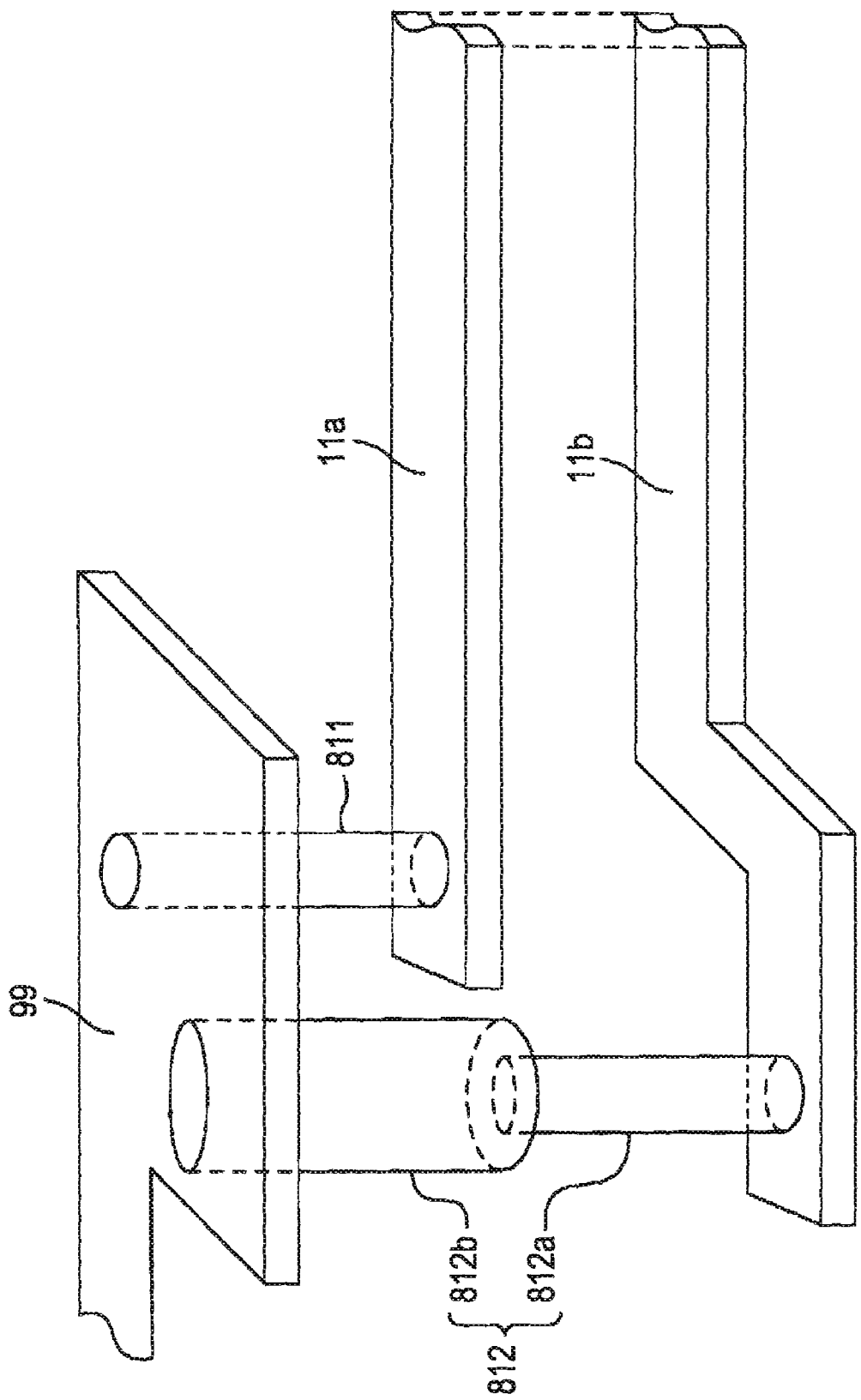

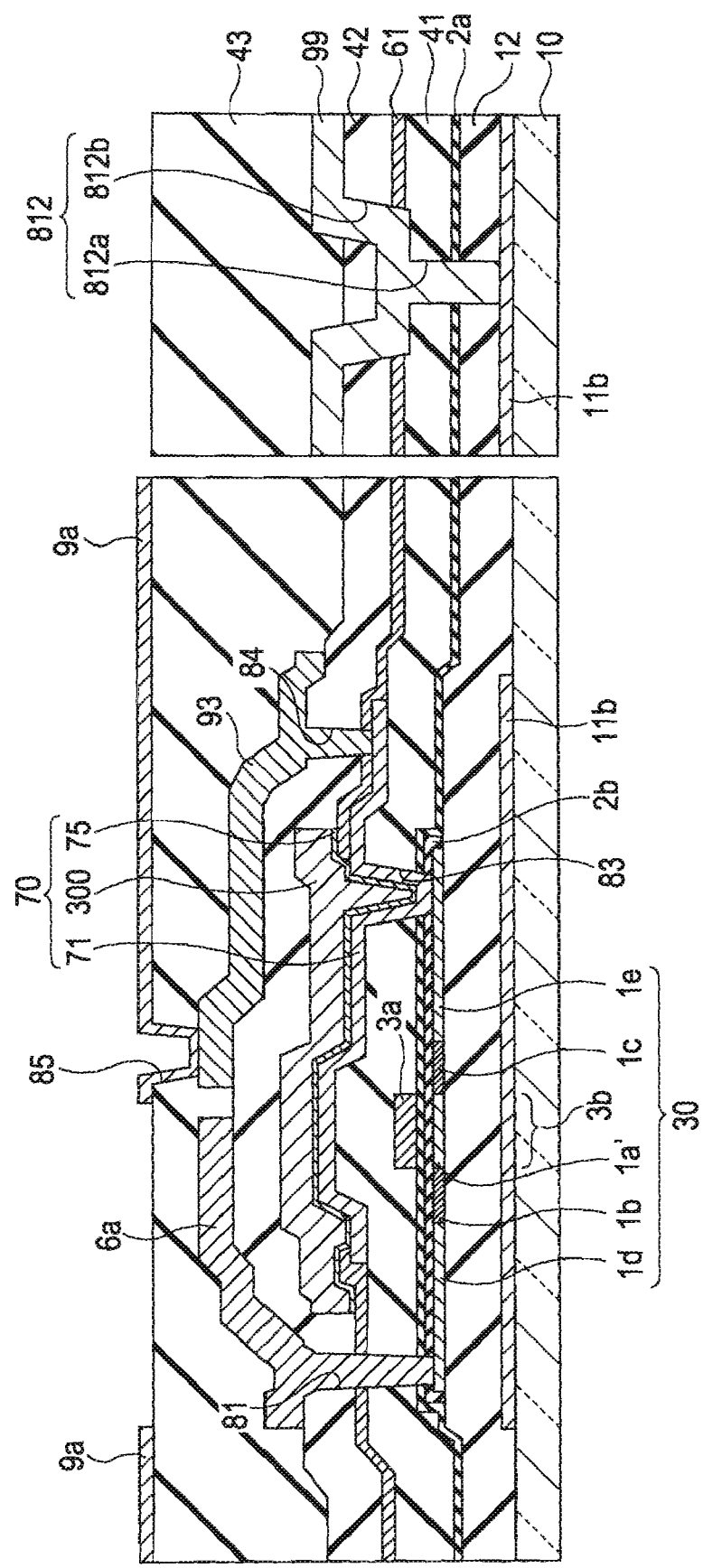

ELECTRO-OPTICAL DEVICE AND
ELECTRONIC APPARATUS INCLUDING
SAME

BACKGROUND

1. Technical Field

The present invention relates to an electro-optical device, such as a liquid crystal device, and to an electronic apparatus including the electro-optical device, such as a liquid crystal projector.

2. Related Art

An electro-optical device of this type includes, above a substrate, a pixel electrode, a scanning line for selectively driving the pixel electrode, a data line, and a thin film transistor (TFT) for switching a pixel. The electro-optical device can be active matrix driven. The electro-optical device may include a storage capacitor between the TFT and the pixel electrode to obtain a higher contrast. These components are built on the substrate with a high density to increase an aperture ratio and reduce the size of the electro-optical device.

A technique for reducing power consumption by using, as a TFT for switching a pixel, a double-gate (or dual-gate) TFT, which has gates arranged, for example, both above and below a semiconductor layer, is disclosed in, for example, JP-A-2002-328617.

Unfortunately, according to the above-described technique, enhancement of functionality or performance basically results in a complex sophisticated laminated structure on a substrate. This causes a technical problem of complicating a manufacturing process and reducing Production yields.

SUMMARY

An advantage of some aspects of the invention is that it provides an electro-optical device suited for simplifying a manufacturing process and capable of displaying a high-quality image and an electronic apparatus including the electro-optical device.

According to a first aspect of the invention, an electro-optical device includes a substrate, a pixel electrode, a transistor, a data line, a pixel-potential-side capacitor electrode, a relay layer, a scanning-line driving circuit, an output line, a first scanning line, and a second scanning line. The transistor is electrically connected to the pixel electrode and includes (i) a semiconductor layer having a channel region, (ii) a first gate electrode above the semiconductor layer and overlapping the channel region, and (iii) a second gate electrode below the semiconductor layer and overlapping the channel region. The data line is disposed above the first gate electrode and connected to the semiconductor layer via a first contact hole. The pixel-potential-side capacitor electrode is electrically connected to the semiconductor layer and the pixel electrode and constitutes a storage capacitor. The relay layer is formed from the same film as the data line, connected to the pixel-potential-side capacitor electrode via a second contact hole, and electrically connected to the pixel electrode. The scanning-line driving circuit is configured to supply a scan signal to the first and second gate electrodes. The output line is formed from the same film as the data line and allows the scan signal from the scanning-line driving circuit to pass therethrough. The first scanning line is formed from the same film as the first gate electrode and connected to the output line via a third contact hole. The third contact hole is opened in the same process of opening the first contact hole. The second scanning line is formed from the same film as the second gate electrode and connected to the output line via a fourth contact hole. The fourth contact hole includes a first opening opened in the same process of opening the first contact hole and a second opening opened in the same process of opening the second contact hole. The first opening and the second opening overlap each other. The pixel electrode, the transistor, the data line, the pixel-potential-side capacitor electrode, the relay layer, the scanning-line driving circuit, the output line, the first scanning line, and the second scanning line are disposed above the substrate.

The electro-optical device according to one aspect of the invention can be used as an electro-optical device, such as a liquid crystal device, functioning as a light valve in a projector. In operation, for example, a scan signal is supplied from the scanning-line driving circuit to the first and second gate electrodes of the transistor via the first and second scanning lines while an image signal is supplied to a source region of the transistor via the data line. Therefore, the transistor can switch the pixel electrode connected to a drain region thereof in response to the image signal, thus enabling a display operation by active matrix driving. In this case, the storage capacitor can improve a characteristic of maintaining the potential in the pixel electrode, and thus, high contrast in display can be realized. For example, the scanning lines, data line, and transistor are arranged in a non-open area around an open area in each pixel corresponding to the pixel electrode (i.e., an area cohere light actually contributed to display is transmitted or reflected in each pixel) in plan view from above the substrate. That is, the scanning lines, data line, and transistor are not arranged in an open area of each pixel, but are arranged within a non-open area to avoid these components from interfering with displaying.

In accordance with one aspect of the invention, in particular, the transistor includes the semiconductor layer, the first gate electrode above the semiconductor layer via, for example, a gate insulator, and the second gate electrode below the semiconductor layer via, for example, a underlying insulator. That is, the transistor has a double-gate, or dual-gate, structure. Therefore, a channel can be provided both above and below the semiconductor layer in the channel region. Wherefore, compared with when the gate electrode is provided only one of above and below the semiconductor layer, current passing through the channel region during operation of the transistor, i.e., on current can be increased.

In accordance with one aspect of the invention, the data line is made from a low-resistance metal (e.g., aluminum) and is disposed above the first gate electrode via, for example, a first interlayer insulator. The data line is electrically connected to the semiconductor layer via, for example, the first contact hole passing through the first interlayer insulator and the gate insulator.

The relay layer is formed from the same film as the data line. Here, the term "the same film" according to one aspect of the invention indicates a film formed in the same occasion in manufacture and being of the same kind. In addition, the phrase "formed from the same film" does not mean that objects must be continuously formed as a single film, but basically means that objects are present at least as separate film sections formed in the same film The relay layer is electrically connected to the pixel-potential-side capacitor electrode, which constitutes a storage capacitor, and the pixel electrode. That is, the relay layer has a function of relaying electrical connection between the pixel-potential-side capacitor electrode and the pixel electrode. The relay layer is electrically connected to the pixel-potential-side capacitor electrode via, for example, the second contact hole passing through a second insulator.

The scanning-line driving circuit is disposed in the peripheral area around a pixel region in which a plurality of pixel electrodes are arranged (or a pixel array region or image display region). The scanning-line driving circuit outputs a scan signal to the output line, which is formed from the same film as the data line.

The first scanning line is formed from the same film as the first gate electrode. Typically, the first scanning line and the first gate electrode can be continuously formed as a single film. The first scanning line is connected to the output line of the scanning-line driving circuit via, for example, the third contact hole passing through the first interlayer insulator, The third contact hole is opened in the same process of opening the first contact hole. Therefore, the manufacturing process can be simplified.

The second scanning line is formed from the same film as the second gate electrode. Typically, the second scanning line and the second gate electrode can be continuously formed as a single film. Since the second scanning line is disposed below the semiconductor layer via, for example, the underlying insulator, the second scanning line is disposed below the output line of the scanning-line driving circuit via at least, for example, the first insulator and the underlying insulator. As a result, compared with the first scanning line, the second scanning line has a longer interlayer distance from the output line.

According to one aspect of the invention, in particular, the second scanning line is connected to the output line of the scanning-line driving circuit via the fourth contact hole, in which the first opening opened in the same process of opening the first contact hole and the second opening opened in the same process of opening the second contact hole are arranged so as to overlap each other. That is, the first contact hole is formed by forming the second opening in the same process of opening the second contact hole and then forming the first opening in the same process of opening the first contact hole so as to overlap the second opening or be formed in the inner bottom surface defining the second opening. Therefore, the fourth contact hole, which connects the output line and the first scanning line and also connects the output line and the second scanning line, whose Interlayer distance is longer than a distance between the data line and the semiconductor layer, can be formed by use of the process of opening the first contact hole for connecting the data line and the semiconductor layer and the process of opening the second contact hole for connecting the relay layer and the pixel-potential-side capacitor electrode. In other words, there is no need to provide a dedicated mask for opening the fourth contact hole independently of a mask for opening each of the first and second contact holes. As a result, the manufacturing process can be simplified.

In addition, according to one aspect of the invention, in particular, as previously describe, the scanning line has a structure that includes the first scanning line and the second scanning line electrically connected to the first gate electrode and the second gate electrode, respectively, i.e., a redundant structure that has double scanning lines for supplying a scan signal to the transistor electrically connected to the pixel electrode. Therefore, even in the event that a fault (e.g., a break) occurs in one of the first and second scanning lines, the other one of the first and second scanning lines can supply a scan signal to the transistor. This can prevent or reduce adverse effects on displaying images, such as appearance of a bright spot on an image caused by inability to supply a scan signal to the transistor. As a result, a high-quality image can be displayed while at the same time reliability of the device can be increased.

As described above, in accordance with the electro-optical device according to one aspect of the invention, the on current of the transistor electrically connected to the pixel electrode can be increased while at the same time the scan signal can be supplied to the transistor reliably. In addition, the fourth contact hole for connecting the output line of the scanning-line driving circuit and the second scanning line can be opened without having to complicate the manufacturing process.

According to one mode of the invention, the second scanning line may include a light-shielding conductive material.

In accordance with this mode of the invention, the second scanning line and the second gate electrode formed from the same film as the second scanning line can be formed from a light-shielding conductive material, such as a refractory metal (e.g., tungsten, titanium, or titanium nitride (TiN). In addition, the second scanning line and the second gate electrode are disposed below the transistor so as to contain a region that faces the channel region of the transistor. Therefore, the second scanning line and the second gate electrode can entirely or substantially shield the channel region of the transistor from returning light, such as reflected light from the backside of the substrate or light that has passed through an optical combining system after having been emitted from another liquid crystal device in a multi-panel projector. That is, the second scanning line can function as a lead for supplying a scan signal and also as a light-shielding film for the transistor against such returning light. As a result, during operation of the device, light leakage current in the transistor can be reduced, a contrast ratio can be improved, and thus a high-quality image can be displayed.

According to another mode of the invention, the semiconductor layer may have a lightly-doped-drain (LDD) region, and the second scanning line at least partially may overlap the LDD region.

In accordance with this mode, an LDD region is disposed on each of both sides of the channel region of the semiconductor layer. That is, the transistor has an LDD structure. The LDD region is disposed on each of both sides of the channel region so as to be mirror images of each other in order to suppress a decrease in the on current during inversion control of liquid crystal in a pixel and to reduce the off current. The LDD region is a region in which impurities are implanted in the semiconductor layer as a base by impurity implantation. The LDD region has a potential gradient due to impurity implantation, and light leakage current is more likely to pass through the LDD region than the other areas of the semiconductor layer. Therefore, according to this mode, since the second scanning line at least partially overlaps the LDD region in plan view from above the substrate, the second scanning line can shield the LDD region from the returning light. As a result, light leakage current occurring in the LDD region can be reduced.

According to another mode of the invention, the second scanning line may at least partially overlap a source region and a drain region of the semiconductor layer.

In accordance with this mode, since the second scanning line at least partially overlaps the source region and the drain region in plan view from above the substrate, the second scanning line can shield the transistor from the returning light more reliably. More specifically for example, the LDD regions adjacent to the source region and the drain region can be shielded from obliquely incident light of the returning light more reliably. Thus, the light leakage current in the transistor can be further reduced According to another mode of the invention, the first opening may be formed inside the second opening in plan view from above the substrate after the second opening is formed.

In accordance with this mode, the fourth contact hole is formed by forming the second opening at a predetermined position in the same process of opening the second contact hole for connecting the pixel-potential-side capacitor electrode and the relay layer and then forming the first opening inside the second opening in the same process of opening the first contact hole for connecting the data line and the semiconductor layer (more specifically, the first opening is opened until the second scanning line is exposed through the bottom defining the second opening. Therefore, the output line and the second scanning line can be reliably connected to each other via the fourth contact hole.

An electronic apparatus according to one aspect of the invention includes the electro-optical device (including various modes).

Since the electronic apparatus according to one aspect of the invention includes the electro-optical device according to one aspect of the invention described above, various electronic apparatuses that can display a high-quality image, such as a projection display apparatus, a television, a cellular phone, an electronic organizer, a personal digital assistant, a word processor, a viewfinder or direct-view video recorder, a workstation, a videophone, a POS terminal, and a touch panel, can be realized. Examples of applicable electronic apparatuses according to one aspect of the invention further include an electrophoresis device (e.g., electronic paper), an electron emission device (e.g., a field emission display (FED) and a surface-conduction electron-emitter display (SED)), and a display that uses at least one of the electrophoresis device and the electron emission device.

Further features and advantages of the invention will become apparent from the best mode for carrying out the invention described below.

BRIEF DESCRIPTION OF THE DRAWINGS

The invention will be described with reference to the accompanying drawings, wherein like numbers reference like elements.

FIG. 11 illustrates a concept of connection between an outputting line and a scanning line.

FIG. 12 is a cross-sectional view that illustrates a structure of a contact hole connecting an outputting line and a scanning line below the semiconductor layer.

DESCRIPTION OF EXEMPLARY EMBODIMENTS

Embodiments of the invention will be described below with reference to the drawings. In the following embodiments, a TFT active-matrix driving liquid crystal device that incorporates a driving circuit will be described as an example of an electro-optical device according to one aspect of the invention.

First Embodiment

Figure 1:
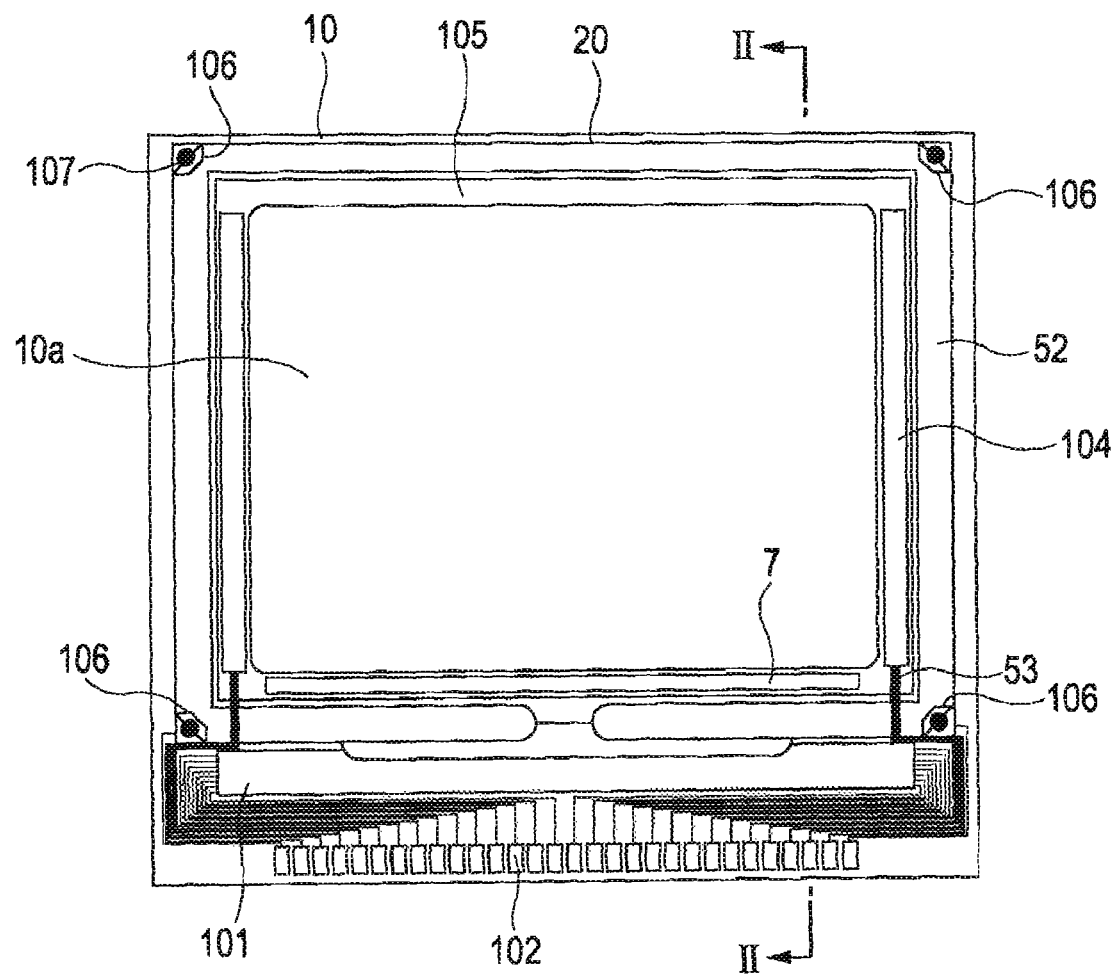
FIG. 1 is a plan view that illustrates a general structure of a liquid crystal device according to a first embodiment.
Figure 2:
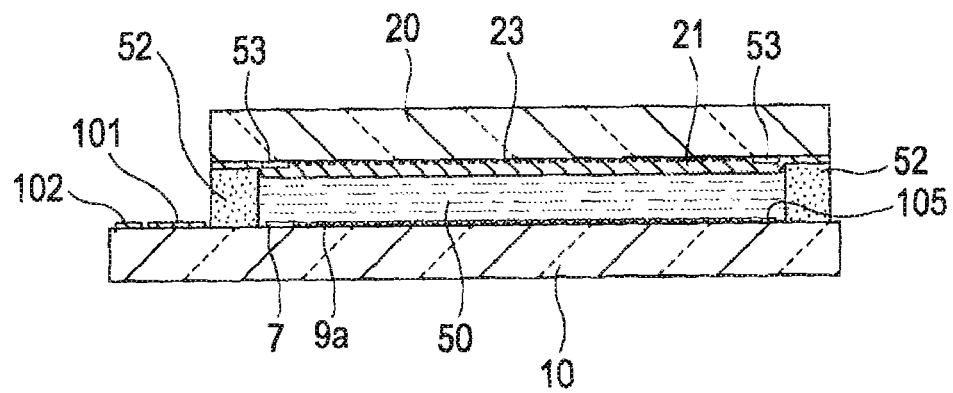
FIG. 2 is a cross-sectional view taken from the line II-II illustrated in FIG. 1.

A liquid crystal device according to the first embodiment will be described with reference to FIGS. 1 to 13A to 13C. First, a general structure of the liquid crystal device according to the present embodiment will be described with reference to FIGS. 1 and 2. FIG. 1 is a plan view that illustrates a general structure of the liquid crystal device according to the present embodiment. FIG. 2 is a cross-sectional view taken from the line II-II illustrated in FIG. 1.

Referring to FIGS. 1 and 2, in the liquid crystal device according to the present embodiment, a TFT array substrate 10 and an opposed substrate 20 are arranged so as to face each other. A gap between the TFT array substrate 10 and the opposed substrate 20 is filled with a liquid crystal layer 50. The TFT array substrate 10 and the opposed substrate 20 are bonded together with a sealing member 52 disposed in a sealing area around an image display region 10a.

Referring to FIG. 1, a frame light-shielding film 53 for defining a frame area of the image display region 10a is disposed in parallel with the inner portion of the sealing area, where the sealing member 52 is present. The frame light-shielding film 53 is adjacent to the opposed substrate 20. A data-line driving circuit 101 and external circuit connecting terminals 102 are disposed along a first side of the TFT array substrate 10 outside the sealing area, where the sealing member 52 is present, of the peripheral area. A sampling circuit 7 is disposed inside the sealing area along the first side so as to be covered by the frame light-shielding film 53. Scanning-line driving circuits 104 are disposed along two sides adjacent to the first side (i.e., left and right sides in FIG. 1) inside the sealing area so as to be covered by the frame light-shielding film 53. A plurality of leads 105 for connecting the two scanning-line driving circuits 104, which are provided at the both sides of the image display region 10a, is disposed along the remaining side of the TFT array substrate 10 so as to be covered by the frame light-shielding film 53. Vertical conduction terminals 106 for connecting the both substrates with a vertical conduction member 107 are disposed on the TFT array substrate 10 so as to face four corners of the opposed substrate 20. These elements enable the TFT array substrate 10 and the opposed substrate 20 to be electrically continuous with each other.

Referring to FIG. 2, a laminated structure in which TFTs for switching pixels and leads, such as scanning lines and data lines, are built is formed on the TFT array substrate 10. In the image display region 10a, pixel electrodes 9a are disposed above the TFTs for switching pixels and the leads, Including scanning lines and data lines. A light-shielding film 23 is disposed on a surface of the opposed substrate 20 facing the TFT array substrate 10. An opposed electrode 21 made from a light-transmitting material (e.g., indium tin oxide (ITO)) is disposed on the light-shielding film 23 so as to face the plurality of pixel electrodes 9a. The liquid crystal layer 50 can be made from, for example, one kind of nematic liquid crystal or a mixture of several kinds thereof, and the liquid crystal molecules are arranged in predetermined alignment between the pair of alignment layers.

Although not illustrated, in addition to the data-line driving circuit 101 and the scanning-line driving circuit 104, a checking circuit or a checking pattern for checking a quality or defect of the liquid crystal device during manufacturing or at shipment may be formed on the TFT array substrate 10.

Figure 3:
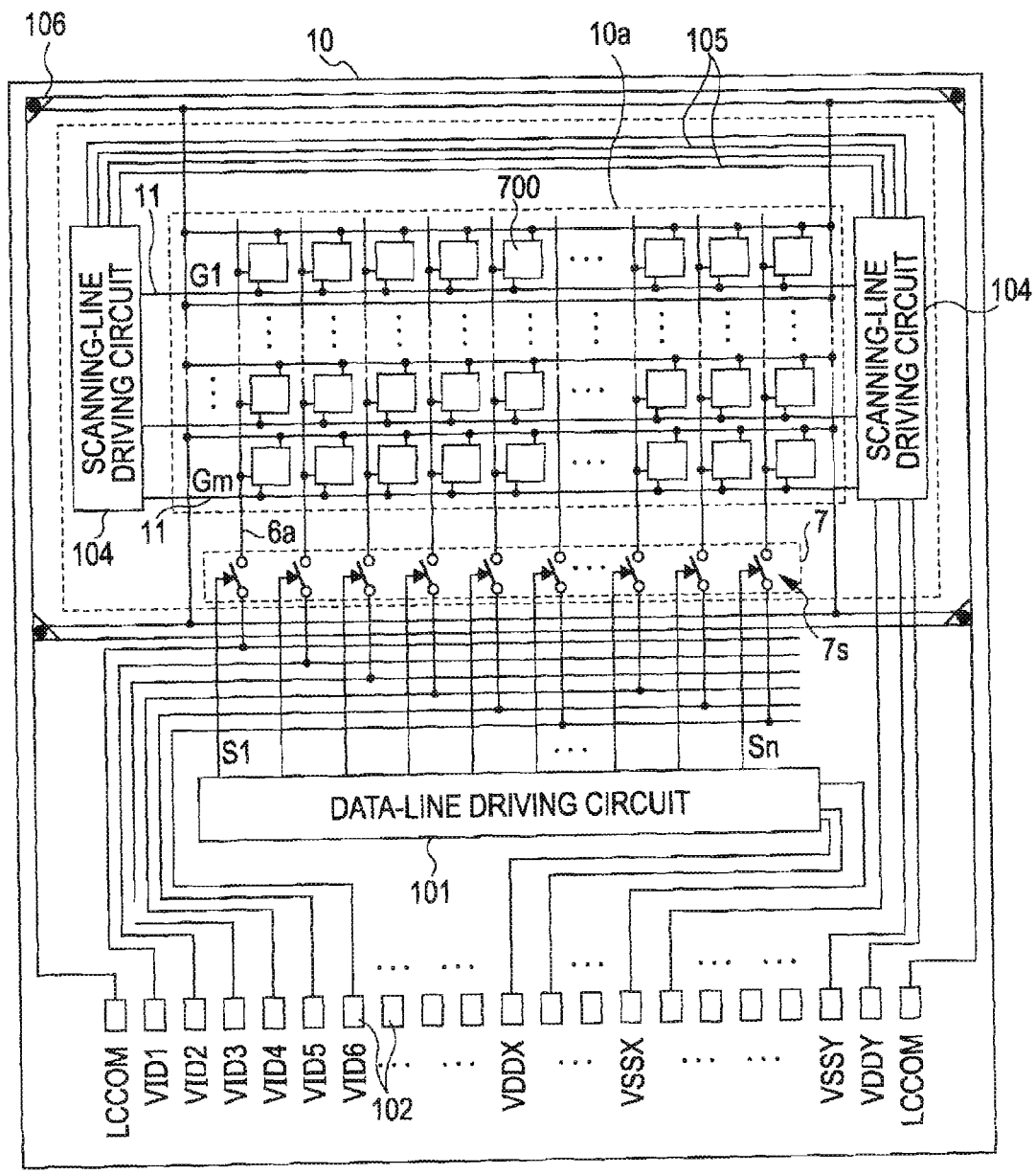
FIG. 3 is a block diagram of a structure of a main portion of the liquid crystal device according to the first embodiment.
Figure 4:
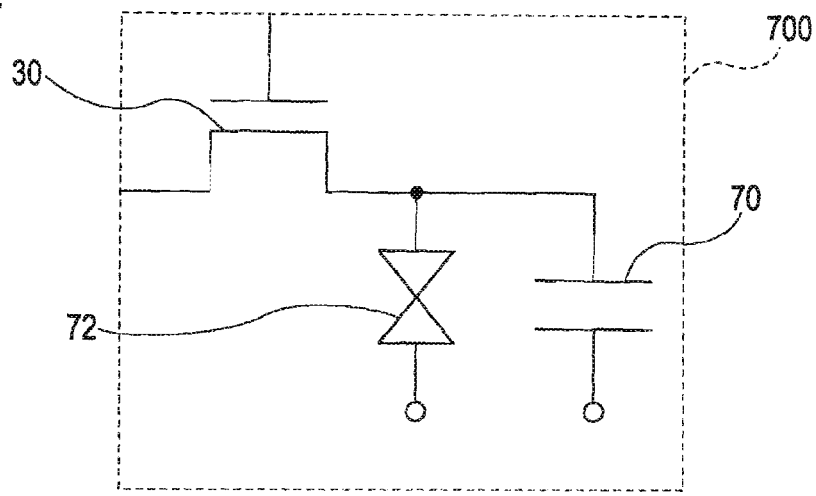
FIG. 4 is a block diagram that illustrates an electrical configuration of a pixel section.

A main structure of the liquid crystal device according to the present embodiment will now be described with reference to FIGS. 3 and 4. FIG. 3 is a block diagram of the structure of a main portion of the liquid crystal device according to the present embodiment. FIG. 4 is a block diagram that illustrates an electrical configuration of a pixel section.

Referring to FIG. 3, in the liquid crystal device according to the present embodiment, driving circuits, such as the scanning-line driving circuit 104, the data-line driving circuit 101, and the sampling circuit 7, are disposed on the peripheral area around the image display region 10a on the TFT array substrate 10.

As illustrated in FIG. 3, various signals, such as a Y clock signal CLY (and an inverted Y clock signal CLY') and a Y start pulse signal; are supplied from an external circuit to the scanning-line driving circuit 104 via the external circuit connecting terminals 102. On the basis of these signals, the scanning-line driving circuit 104 sequentially generates scan signals G1, ..., and Gm in this order and outputs them to scanning lines 11. As will be described below, each of the scanning lines 11 includes scanning lines 11a and 11b. Scanning-line driving circuit powers VDDY and VSSY for driving the scanning-line driving circuit 104 and various control signals are supplied to the scanning-line driving circuit 104 via the external circuit connecting terminals 102. The potential of the scanning-line driving circuit power VDDY is set to be higher than that of the scanning-line driving circuit power VSSY.

Referring to FIG. 3, an X clock signal and an X start pulse are supplied from an external circuit to the data-line driving circuit 101 via the external circuit connecting terminals 102. In response to receipt of the X start pulse, the data-line driving circuit 101 sequentially generates sampling signals S1, ..., and Sn at a time based on the X clock signal, and outputs them. Data-line driving circuit powers VDDX and VSSX for driving the data-line driving circuit 101 and various control signals are supplied to the data-line driving circuit 101 via the external circuit connecting terminals 102. The potential of the data-line driving circuit power VDDX is set to be higher than that of the data-line driving circuit power VSSX.

The sampling circuit 7 includes a plurality of sampling switches 7s each formed of a single-channel (i.e., p-channel or n-channel) TFT or a complementary TFT.

As illustrated in FIG. 3; the liquid crystal device according to the present embodiment further includes a plurality of pixel sections 700 arranged in a matrix in the image display region 10a, which occupies a central portion of the TFT array substrate 10.

Referring to FIG. 4, each of the pixel sections 700 includes a TFT 30 for switching a pixel, a liquid crystal element 72, and a storage capacitor 70.

The TFT 30 is one example of a "transistor" according to one aspect of the invention. The TFT 30 includes a source electrically connected to a data line 6a, a gate electrically connected to the scanning line 11, and a drain electrically connected to the pixel electrode 9a of the liquid crystal element 72, which will be described below. The pixel switching TFT 30 is switched on or off in response to a scan signal supplied from the scanning-line driving circuit 104. As will be described below, in the present embodiment, the pixel switching TFT 30 has a double-gate structure, which includes two gate electrodes.

The liquid crystal element 72 includes the pixel electrode 9a, the opposed electrode 21, and liquid crystal sandwiched therebetween. In the liquid crystal element 72, an image signal having a predetermined level written in the liquid crystal via the data line 6a and the pixel electrode 9a is maintained in a predetermined period of time between the liquid crystal and the opposed electrode 21. The liquid crystal changes the orientation or order of molecular self-assembly depending on the level of an applied voltage, thereby modulating light and thus enabling gray-scale display. For the normally white mode, the transmittance to incident light reduces in response to a voltage applied in units of a pixel. For the normally black mode, the transmittance to incident light increases in response to a voltage applied in units of a pixel. As a whole, light having a contrast corresponding to an image signal exits from the electro-optical device.

The storage capacitor 70 is substantially parallel to a liquid crystal capacitor formed between the pixel electrode 9a and the opposed electrode 21 in order to avoid leakage of a stored image signal.

The pixel sections 700 described above are arranged in a matrix in the image display region 10a and thus can be active matrix driven.

Referring again to FIG. 3, image signals VID1 to VID6, which are produced by serial-to-parallel conversion into six phases, are supplied to the respective data lines 6a in units of a set of six data lines 6a. The number of phase conversions (i.e., the number of lines into which an image signal is serial-to-parallel converted) is not limited to six. That is, image signals converted into multiple phases (e.g., 9, 12, or 24) may be supplied to a set of data lines 6a grouped so as to correspond to the number of conversions. Alternatively, image signals may be sequentially supplied to the data lines 6a without being serial-to-parallel converted.

Figure 5:
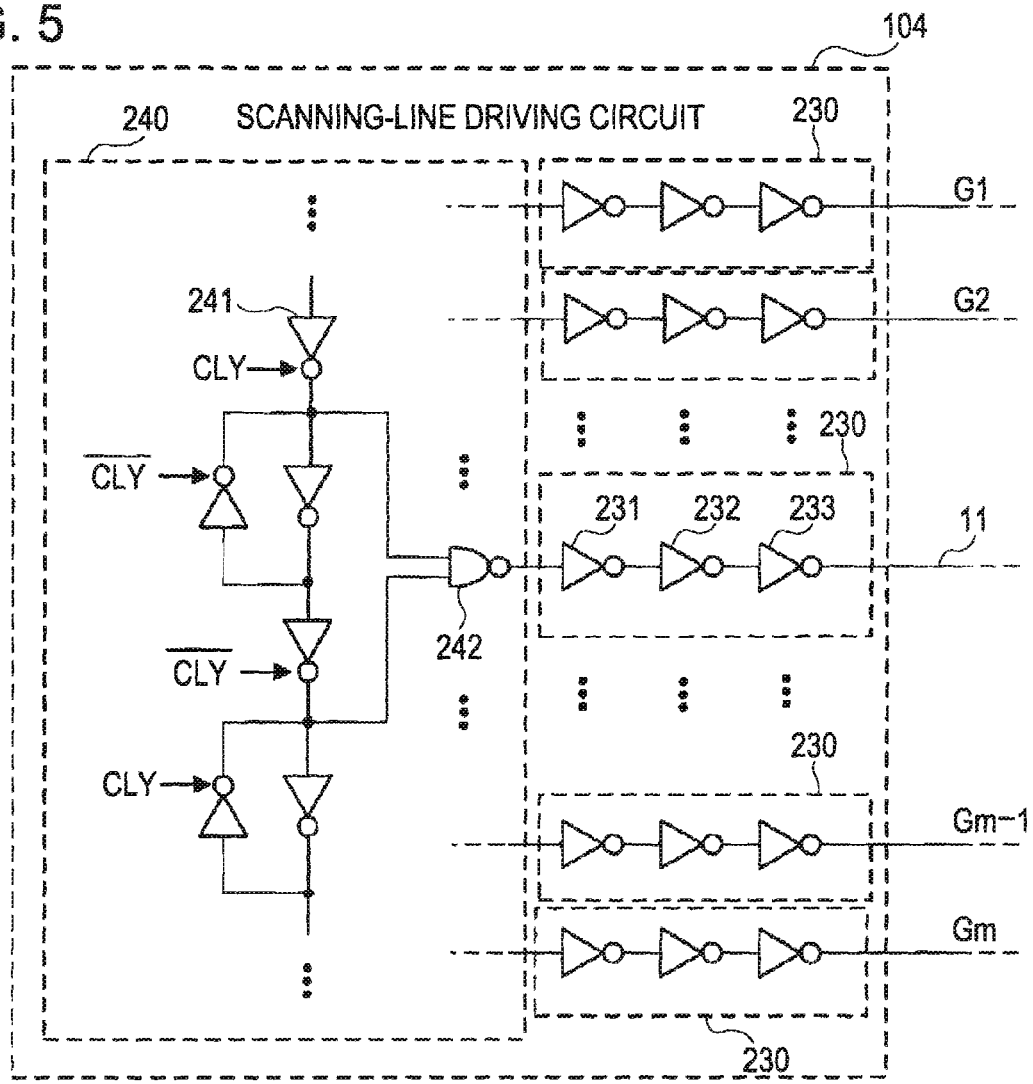
FIG. 5 is a schematic circuit diagram that illustrates an electrical configuration of a scanning-line driving circuit.
Figure 6:
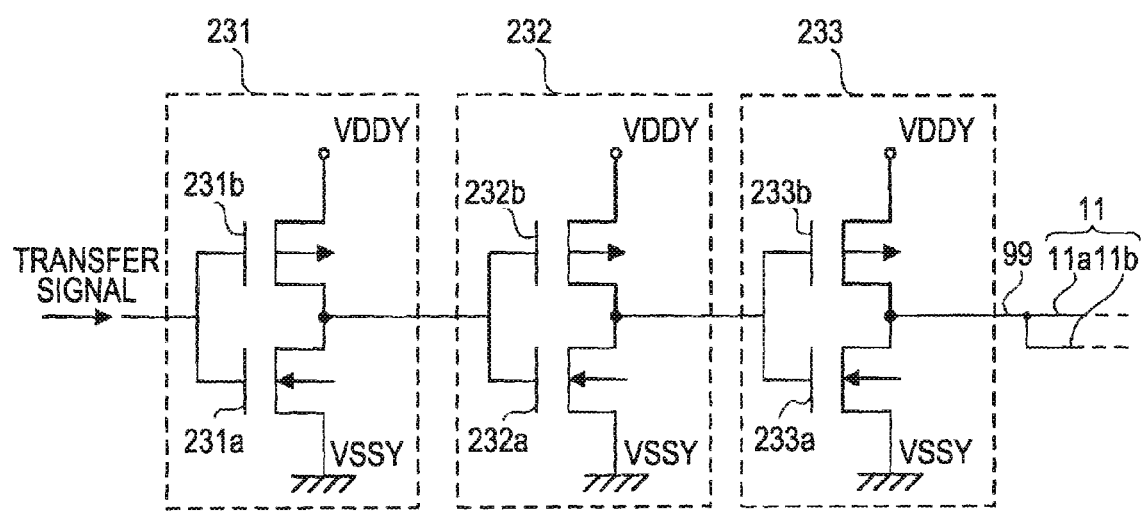
FIG. 6 is a schematic circuit diagram that illustrates an electrical configuration of an output buffer in the scanning-line driving circuit.

The scanning-line driving circuit 104 in the liquid crystal device according to the present embodiment will be described with reference to FIGS. 5 and 6. FIG. 5 is a schematic circuit diagram that illustrates an electrical configuration of the scanning-line driving circuit 104. FIG. 6 is a schematic circuit diagram that illustrates an electrical configuration of an output buffer included in the scanning-line driving circuit 104.

Referring to FIG. 5, the scanning-line driving circuit 104 includes a shift register 240 and a plurality of output buffers 230.

The shift register 240 includes a plurality of inverters 241 and a NAND circuit 242. The shift register 240 sequentially outputs transfer signals on the basis of the Y clock signal CLY and inverted Y clock signal CLY' at the time when an image signal is to be supplied to the pixel sections 700 and transfers them to the output buffers 230.

Each of the output buffers 230 includes inverters 231, 232, and 233 electrically connected In series. An input terminal of the output buffer 230 is electrically connected to an output terminal of the shift register 240. A transfer signal from the shift register 240 is supplied to the input terminal of the output buffer 230. The output buffer 230 causes the transfer signal transferred from the shift register 240 to have a driving capability. The transfer signal that has obtained the driving capability (in other words, the capability of supplying current) is finally supplied as a scan signal from the scanning-line driving circuit 104 to the pixel section 700 via the scanning line 11. As described above, since the output buffer 230 includes the plurality of inverters 231, 232, and 233, the output buffer 230 has a function of outputting a transfer signal as a scan signal after increasing the driving capability, shaping a waveform, and adjusting the timing. In addition, the scanning-line driving circuit 104 may further include a waveform control circuit for obtaining an interval between scan signals output at approximately the same time by limiting a pulse width of each scan signal or an enable circuit. Moreover, an output control circuit for altering the sequence of output to scan a plurality of regions in which the image display region 10a is divided in units of a region, i.e., to perform a scan by a region scanning method may be disposed between the shift register 240 and the output buffer 230 or between the output buffer 230 and the scanning line 11.

As illustrated in detail in FIG. 6, the inverter 231 includes a TFT 231a and a TFT 231b. Similarly, the inverter 232 includes a TFT 232a and a TFT 232b, and the inverter 233 includes a TFT 233a and a TFT 233b. The input terminal of the output buffer 230 is electrically connected to a gate of each of the TFT 231a and TFT 231b. An outputting line 99 of the output buffer 230 is electrically connected to a drain of each of the TFT 233a and TFT 233b. The outputting line 99 is further electrically connected to each of the scanning lines 11a and 11b constituting the scanning line 11. The outputting line 99 is one example of an "output line" according to one aspect of the invention.

The inverters 231, 232, and 233 are driven by the scanning line driving circuit powers VDDY and VSSY. Therefore, the voltage of each of the transfer signals changes between the potential of the scanning-line driving circuit power VDDY and that of the scanning-line driving circuit power VSSY, the driving capability is gradually increased, and the transfer signals are output as the scan signals G1, G2, . . . , Gm−1, and Gm from the scanning-line driving circuit 104 via the outputting line 99.

Figure 7:
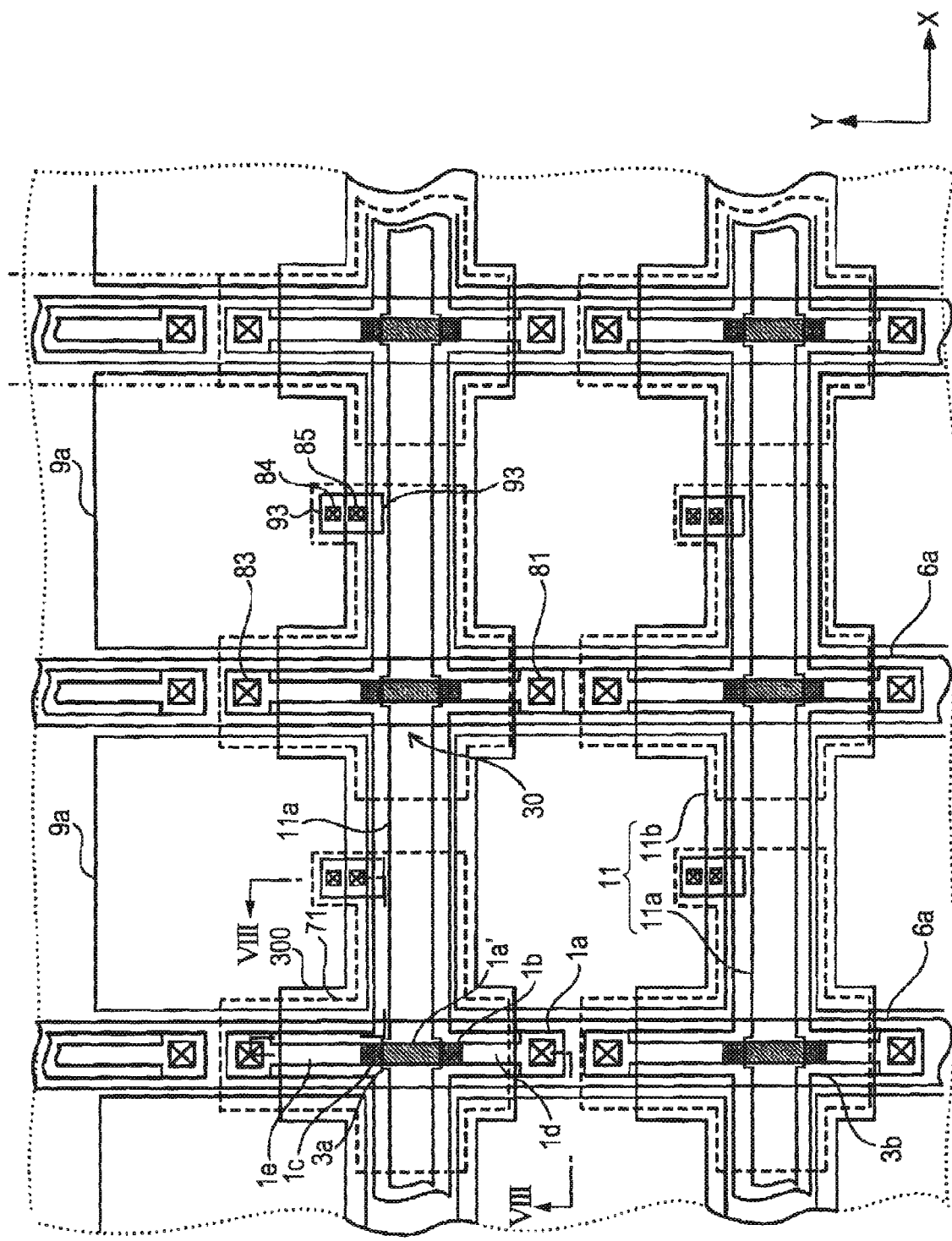
FIG. 7 is a plan view of adjacent pixel sections.
Figure 8:
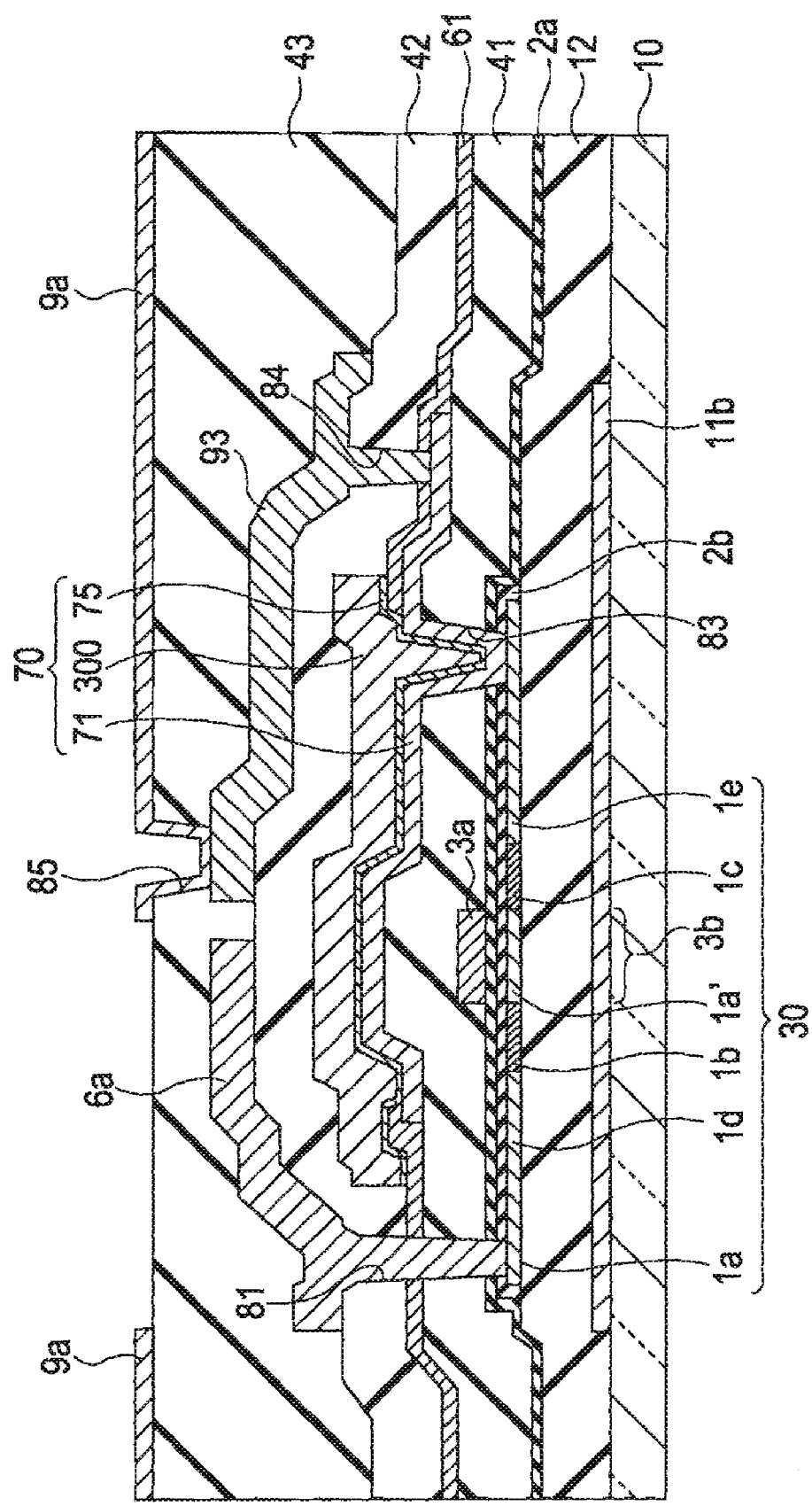
FIG. 8 is a cross-sectional view taken from the line VIII-VIII illustrated in FIG. 7.
Figure 9:
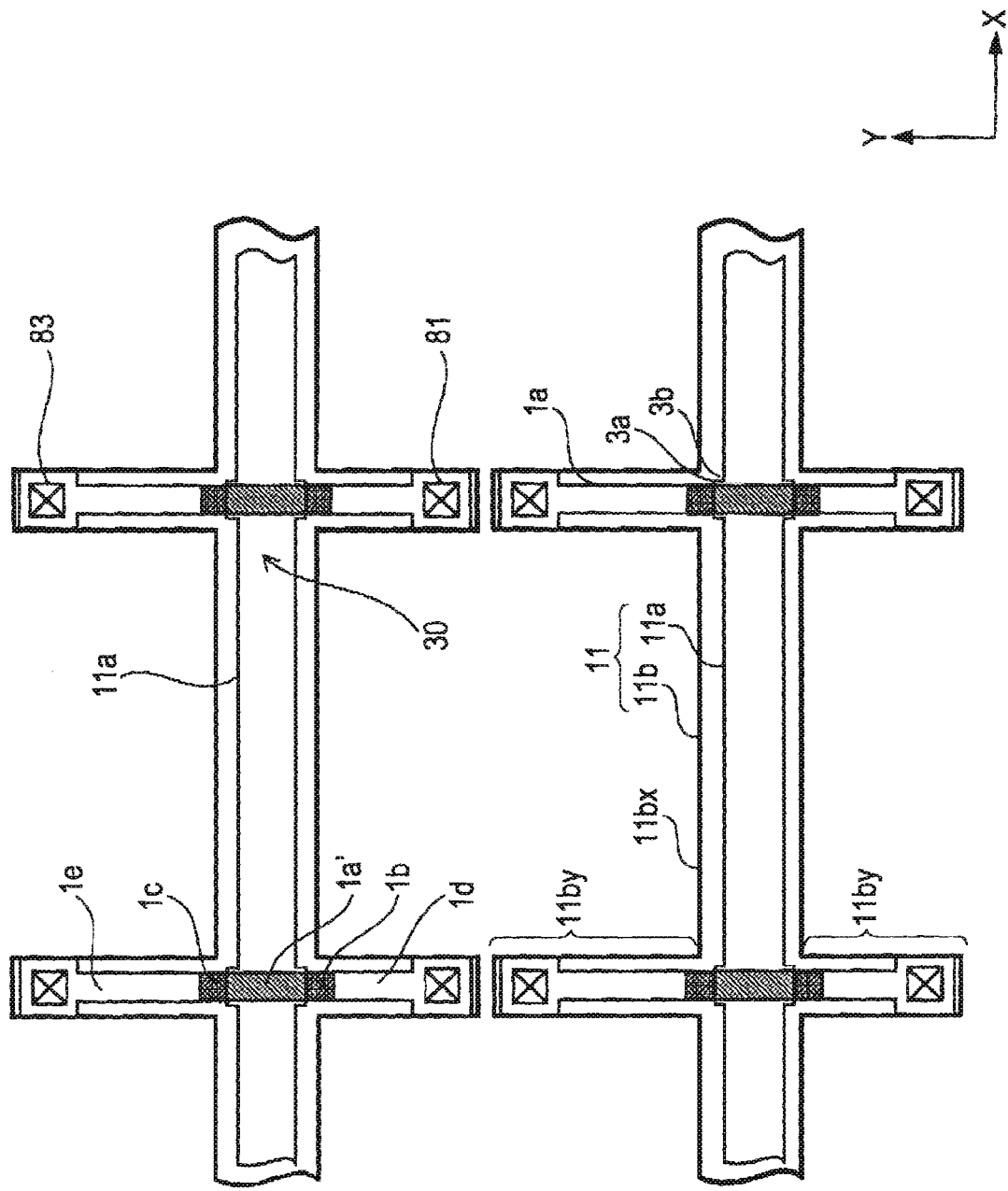
FIG. 9 is a plan view that illustrates a layout of scanning lines above and below a semiconductor layer.

A specific structure of the pixel section 700 in the liquid crystal device according to the present embodiment will now be described with reference to FIGS. 7 to 9. FIG. 7 is a plan view of adjacent pixel sections 700. FIG. 8 is a cross-sectional view taken from the line VIII-VIII illustrated in FIG. 7. FIG. 9 is a plan view that illustrates a layout of the scanning lines 11 disposed above and below a semiconductor layer. In FIGS. 7 to 9, layers and components are illustrated with different scales so that each of the layers and components has a recognizable size in the drawings. In FIGS. 7 to 9, for the sake of illustration, a portion above the pixel electrode 9a is omitted.

Referring to FIG. 7, the pixel electrodes 9a are arranged in a matrix on the TFT array substrate 10. The data lines 6a and the scanning lines 11 (i.e., scanning lines 11a and 11b) extend along the vertical and horizontal borders of the pixel electrodes 9a, respectively. That is, the scanning lines 11a and 11b extend in the X direction, and the data lines 6a extend in the Y direction so as to intersect the scanning lines 11a or 11b. The pixel switching TFT 30 is disposed at each of the intersections of the scanning lines 11a and the data lines 6a.

Referring to FIGS. 7 and 8, the TFT 30 includes a semiconductor layer 1a and gate electrodes 3a and 3b.

The semiconductor layer 1a can be made from, for example, polysilicon and includes a channel region 1a', a low-density source region 1b, a low-density drain region 1c, a high-density source region 1d, and a high-density drain region 1e. That is, the TFT 30 has a lightly-doped-drain (LDD) structure. The low-density source region 1b and the low-density drain region 1c are one example of an "LDD region" according to one aspect of the invention. The low-density source region 1b, the low-density drain region 1c, the high-density source region 1d, and the high-density drain region 1e can be an impurity area produced by implanting impurities in the semiconductor layer 1a by, for example, ion plantation. These impurity areas can reduce the off current passing through the source and drain regions during non-operation of the TFT 30 and can suppress the on current passing during operation of the TFT 30. It is preferable that the TFT 30 have an LDD structure. However, the TFT 30 may have an offset structure in which impurities are not implanted in the low-density source region 1b and the low-density drain region 1c or a self-aligned structure in which impurities are highly implanted in T the high-density source and drain regions by use of the gate electrode 3a as a mask.

As illustrated in FIGS. 7 to 9, the gate electrode 3a is formed as part of the scanning line 11a and can be made from, for example, conductive polysilicon. The scanning line 11a includes a main line extending in the X direction and also includes a segment extending in the Y direction so as to overlap a section within the channel region 1a' of the TFT 30 that does not overlap the main line. A portion of the scanning line 11a that overlaps the channel region 1a, functions as the gate electrode 3a. The gate electrode 3a and the semiconductor layer 1a are insulated from each other by a gate insulator 2 (more specifically, two insulators 2a and 2b).

As illustrated in FIGS. 7 to 9, the gate electrode 3b is formed as part of the scanning line 11b. The scanning line 11b includes a main line 11bx patterned in a striped shape and extending in the X direction and an extended section 11by extending from the main line 11bx in the Y direction in plan view. A portion of the scanning line 11b that overlaps the channel region 1a' functions as the gate electrode 3b. The scanning line lab contains an area that faces the channel region 1a', the low-density source region 1b, the low-density drain region 1c, the high-density source region 1d, and the high-density drain region 1e of the TFT 30. The scanning line 11b and the semiconductor layer 1a are insulated from each other by an underlying insulator 12. The underlying insulator 12 has a function of insulating the TFT 30 from the scanning line 11b. Since the underlying insulator 12 is formed over substantially the entire surface of the TFT array substrate 10, the underlying insulator 12 also has a function of avoiding or reducing degradation in characteristics of the pixel switching TFT 30 caused by roughness produced by polishing the surface of the TFT array substrate 10 or caused by contamination remaining after cleaning As described above, according to the present embodiment, in particular, the TFT 30 includes the semiconductor layer 1a, the gate electrode 3a, which is formed as part of the scanning line 11a disposed above the semiconductor layer 1a via the gate insulator 2, and the gate electrode 3b, which is formed as part of the scanning line 11b disposed below the semiconductor layer 1a via the underlying insulator 12. That is, the TFT 30 has a double-gate structure. Therefore, a channel can be formed both above and below the channel region 1a, of the semiconductor layer 1a. Thus, compared with when a gate electrode is formed only one of above and below the semiconductor layer 1a, the on current of the TFT 30 can be higher.

According to the present embodiment, the thickness of the gate insulator 2 is approximately 50 nm to 100 nm and the thickness of the underlying insulator 12 is approximately 400 nm to 600 nm. In terms of an increase in the on current of the TFT 30, it is preferable that the gate insulator 2 and the underlying insulator 12 be thinner. However, even if the thickness of the underlying insulator 12 is larger than 600 nm, for example, forming the gate electrode 3b so as to overlap at least partially the channel region 1a' in plan view can offer an adequate effect of increasing the on current of the TFT 30.

Furthermore, according to the present embodiment, in particular, the scanning line 11b can be made from a light-shielding conductive material, such as a refractory metal (e.g., tungsten, titanium, or titanium nitride (TiN)). In addition, as illustrated in FIG. 9, the scanning line 11b contains an area that faces the channel region 1a', the low-density source region 1b, and the low-density drain region 1c of the semiconductor layer 1a below the semiconductor layer 1a. Therefore, the scanning line 11b can entirely or substantially shield the channel region 1a' of the TFT 30 from returning light, such as reflected light from the backside of the TFT array substrate 10 or light that has passed through an optical combining system after having been emitted from another liquid crystal device in a multi-panel projector. That is, the scanning line 11b can function as a lead for supplying a scan signal and also as a light-shielding film for the TFT 30 against such returning light. As a result, during operation of the device, light leakage current of the TFT 30 can be reduced, a contrast ratio can be improved, and thus a high-quality image can be displayed.

As illustrated in FIG. 9, according to the present embodiment, in particular, the scanning line 11b contains an area that faces the low-density source region 1b and the low-density drain region 1c in plan view from above the TFT array substrate 10. Therefore, the scanning line 11b can shield the low-density source region 1b and the low-density drain region 1c from the returning light described above. As a result, light leakage current occurring in the low-density source region 1b and the low-density drain region 1c can be reduced.

In addition, as illustrated in FIG. 9, according to the present embodiment, in particular, the scanning line 11b contains an area that faces the high-density source region 1d and the high-density drain region 1e in plan view from above the TFT array substrate 10. Therefore, the TFT 30 can be shielded by the scanning line 11b from the returning light described above more reliably. More specifically, for example, the low-density source region 1b and the low-density drain region 1c adjacent to the high-density source region 1d and the high-density drain region 1e, respectively, can be shielded from obliquely incident light of the returning light described above more reliably. Thus, the light leakage current of the TFT 30 can be reduced more reliably.

According to the present embodiment, In particular, as described above with reference to FIGS. 7 and 8, the scanning line 11a, which contains the gate electrode 3a, and the scanning line 11b, which contains the gate electrode 3b are included. That is, the scanning line 11 for supplying a scan signal to the TFT 30 has a redundant structure that is a double-lead arrangement consisting of the scanning line 11a and the scanning line 11b. Therefore, even in the event that a fault (e.g., a break) occurs in one of the scanning lines 11a and 11b, the other one of the scanning lines 11a and 11b can supply a scan signal to the TFT 30. This can prevent or reduce adverse effects on displaying images, such as appearance of a bright spot on an image caused by inability to supply a scan signal to the pixel switching TFT 30. As a result, a high-quality image can be displayed while at the same time reliability of the device can be increased.

Referring to FIG. 8, the storage capacitor 70 is disposed above the TFT 30, which is disposed above the TFT array substrate 10. An interlayer insulator 41 is disposed between the TFT 30 and the storage capacitor 70.

The storage capacitor 70 includes a lower capacitor electrode 71, an upper capacitor electrode 300, and a dielectric 75. The capacitor electrode 71 faces the upper capacitor electrode 300 with the dielectric 75 disposed therebetween.

The upper capacitor electrode 300 extends from the image display region 10a, where the pixel electrodes 9a are arranged, to the periphery thereof. The upper capacitor electrode 300 is electrically connected to a constant-potential source and is a fixed-potential-side capacitor electrode maintained at a fixed potential. The upper capacitor electrode 300 can be made of a non-transparent metal film that contains a metal, for example, aluminum or silver, or alloy and functions as an upper light-shielding film (internal light-shielding film) for shielding the TFT 30 from light. The upper capacitor electrode 300 may be made from an elemental metal, alloy, metal silicide, polysilicide that contains at least one refractory metal selected from titanium, chromium, tungsten, tantalum, molybdenum, palladium, and other elements, or a laminated structure thereof.

The lower capacitor electrode 71 is a pixel-potential-side capacitor electrode electrically connected to the high-density drain region 1e of the TFT 30 and one of the pixel electrodes 9a. More specifically, the lower capacitor electrode 71 is electrically connected to the high-density drain region 1e via a contact hole 83 and electrically connected to a relay layer 93 via a contact hole 84. The contact hole 84 is one example of a "second contact hole" according to one aspect of the invention. The relay layer 93 is electrically connected to the pixel electrode 9a via a contact hole 85. That is, the lower capacitor electrode 71 relays electrical connection between the high-density drain region 1e and the pixel electrode 9a in cooperation with the relay layer 93. The lower capacitor electrode 71 is made from conductive polysilicon. The storage capacitor 70 has a so-called metal-insulator-semiconductor (MIS) structure. The lower capacitor electrode 71 functions as, in addition to a pixel-potential-side capacitor electrode, a light-absorbing layer or light-shielding film disposed between the upper capacitor electrode 300, functioning as an upper light-shielding film; and the TFT 30.

The dielectric 75 has a single-layer or multi-layer structure including, for example; a silicon oxide film (e.g., a high temperature oxide (HTO) film, a low temperature oxide (LTO) film) or a silicon nitride film.

The lower capacitor electrode 71 may be made of a metal film, as in the upper capacitor electrode 300. That is, the storage capacitor 70 may have a so-called metal-insulator-metal (MIM) structure, which is a three-layer structure of a metal film, dielectric (insulator), and a metal film. In this case, compared with when the lower capacitor electrode 71 is made from polysilicon, power consumption in the entire liquid crystal device during driving thereof can be reduced, and the element of each pixel section can be driven at higher speed.

Referring to FIG. 8, the data line 6a and the relay layer 93 are disposed above the storage capacitor 70 above the TFT array substrate 10. An interlayer insulator 42 is disposed between the storage capacitor 70 and the relay layer 93. An insulator 61 is partially disposed between the interlayer insulators 41 and 42.

The data line 6a is electrically connected to the high-density source region 1d of the semiconductor layer 1a via a contact hole 81 passing through the interlayer insulator 41, the insulator 61, and the interlayer insulator 42. The contact hole 81 is one example of a "first contact hole" according to one aspect of the invention. The data line 6a and the inside of the contact hole 81 can be formed from an aluminium-containing material, such as aluminum-silicon-copper or aluminum-copper, elemental aluminum, or multiple layers of an aluminum layer and a TiN layer. The data line 6a also has a function of shielding the TFT 30 from light.

The relay layer 93 is formed in the same layer as the data line 6a on the interlayer insulator 42. The data line 6a and the relay layer 93 can be produced by, for example, forming a thin film made from a conductive material, such as a metal film, on the Interlayer insulator 42 by a thin film process and then removing a portion of the thin film, i.e., patterning to separate them. As a result, since the data line 6a and the relay layer 93 can be formed in the same process, the process of manufacturing the device can be simplified.

Referring to FIG. 8, the pixel electrode 9a is disposed above data line 6a. An interlayer insulator 43 is disposed between the data line 6a and the pixel electrode 9a. The pixel electrode 9a is electrically connected to the high-density drain region 1e of the semiconductor layer 1a via the lower capacitor electrode 71, the contact holes 83, 84, and 85, and the relay layer 93. The contact hole 85 is formed by depositing a conductive material from which the pixel electrode 9a is made, such as ITO, on the interior wall of an opening passing through the interlayer insulator 43. An alignment layer subjected to predetermined alignment processing, such as rubbing, is formed on the top surface of the pixel electrode 9a.

As illustrated in FIG. 7, the structure of the pixel section described above is common to all pixel sections. The pixel sections are periodically formed in the image display region 10a (see FIG. 1). As previously described with reference to FIGS. 1 and 2, driving circuits, including the scanning-line driving circuit 104 and the data-line driving circuit 101, are disposed in the peripheral area around the image display region 10a.

Figure 10:
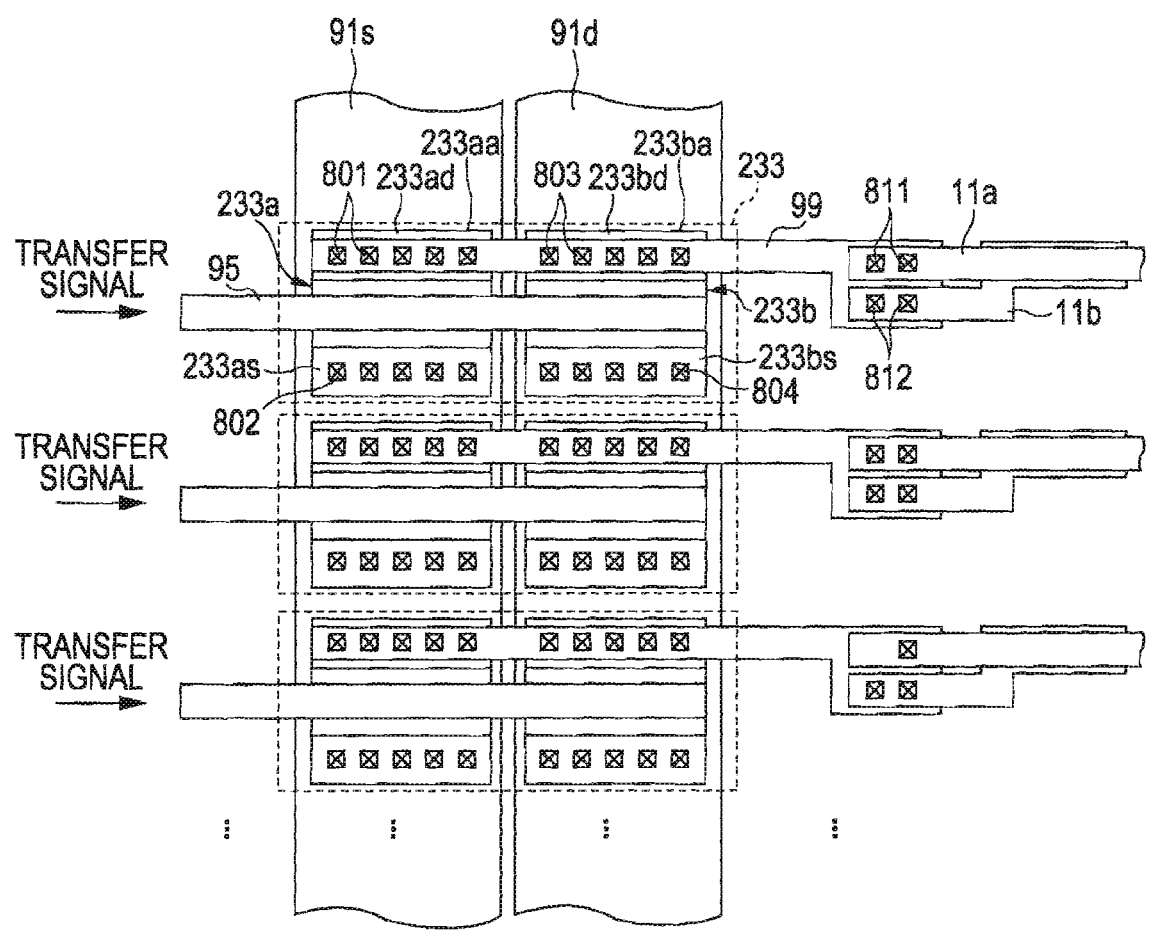
FIG. 10 is a plan view that illustrates a specific structure of the output buffer in the scanning-line driving circuit.

A specific structure of each of the output buffers included in the scanning-line driving circuit 104 in the liquid crystal device according to the present embodiment will now be described below with reference to FIGS. 6 and 10. FIG. 10 is a plan view that illustrates a specific structure of the output buffer in the scanning-line driving circuit 104. FIG. 10 illustrates a specific structure of the Inverter 233 in the output buffer 230. The other inverters 231 and 232 (see FIG. 6) in the output buffer 230 have substantially the same structure. The following description focuses on the structure of the inverter 233.

Referring to FIG. 10, the inverter 233 includes the TFTs 233a and 233b. The TFT 233a includes a semiconductor film 233aa formed as the same film as the semiconductor layer 1a (see FIG. 8) in the pixel section 700 described above.

The TFT 233a includes a source region 233 as electrically connected to a power-supply lead 91s for supplying the scanning-line driving circuit power VSSY via a contact hole 802. The power-supply lead 91s is formed as the same film as the upper capacitor electrode 300 (see FIG. 8) described above. The contact hole 802 passes through the interlayer insulator 41 and the insulator 61.

The TFT 233b includes a source region 233bs electrically connected to a power-supply lead 91d for supplying the scanning-line driving circuit power VDDY via a contact hole 804. The power-supply lead 91d is formed as the same film as the upper capacitor electrode 300, as in the case of the power-supply lead 91s. The contact hole 804 passes through the interlayer insulator 41 and the insulator 61, as in the case of the contact hole 802.

The TFT 233a includes a drain region 233ad electrically connected to the outputting line 99 via a contact hole 801. The outputting line 99 is formed as the same film as the data line 6a (see FIG. 8) described above. The contact hole 801 passes through the Interlayer insulator 41, the insulator 61, and the interlayer insulator 42.

The TFT 233b includes a drain region 233bd electrically connected to the outputting line 99 via a contact hole 803, as in the case of the drain region 233ad of the TFT 233a. The contact hole 803 passes through the Interlayer insulator 41 the insulator 61, and the interlayer insulator 42, as in the case of the contact hole 801. As a result, the drain region 233ad of the TFT 233a and the drain region 233bd of the TFT 233b are electrically connected to each other via the contact hole 801, the outputting line 99, and the contact hole 803.

A gate lead 95 is disposed as a gate electrode of each of the TFTs 233a and 233b. The gate lead 95 is formed from the same film as the gate electrode 3a (see FIG. 8) of the pixel switching TFT 30 in the pixel section 700. As previously described with reference to FIG. 6, the gate lead 95 is electrically connected to the output terminal of the inverter 232. A gate lead of the inverter 232 is electrically connected to the output terminal of the inverter 231. A gate lead of the inverter 231 is electrically connected to the output terminal of the shift register 240.

Figure 13A:
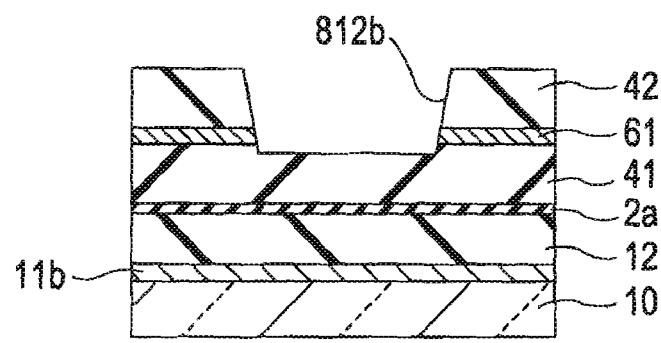
FIGS. 13A to 13C illustrate a process for manufacturing the contact hole for connecting the outputting line and the scanning line below the semiconductor layer.
Figure 13B:
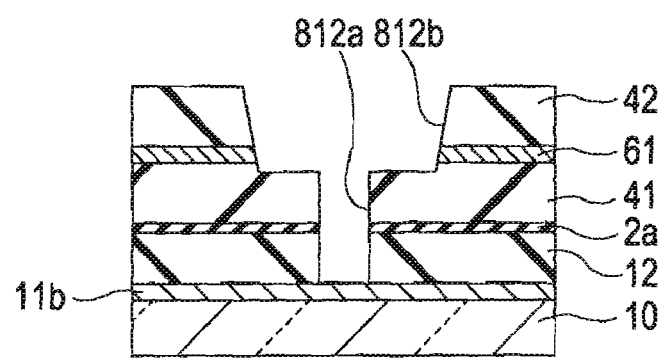
Figure 13C:
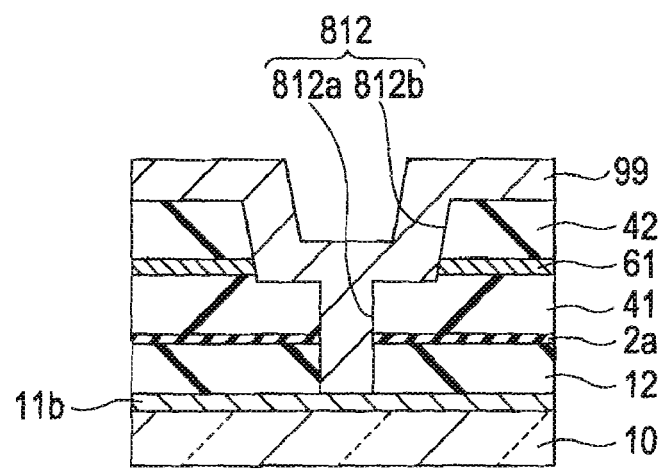

A structure of connection between the outputting line 99 of the output buffer 230 and the scanning line 11 will now be described below with reference to FIGS. 10 to 13C. FIG. 11 illustrates a concept of the structure of connection between the outputting line 99 and the scanning line 11. FIG. 12 is a cross-sectional view that illustrates a specific structure of a contact hole that electrically connects the outputting line 99 and the scanning line 11b below the semiconductor layer 1a while illustrating the structure of the pixel section 700 for comparison. FIGS. 13A to 13C illustrate a process for manufacturing the contact hole that electrically connects the outputting line 99 and the scanning line 11b below the semiconductor layer 1a. In FIGS. 11 to 13C, layers and components are illustrated with different scales so that each of the layers and components has a recognizable size in the drawings. For the sake of illustrations FIG. 11 illustrates only the outputting line 99, the scanning lines 11a and 11b, and contact holes for electrically connecting them.

Referring to FIGS. 10 and 11, the outputting line 99 is electrically connected to the scanning line 11a via a contact hole 811. The contact hole 811 is one example of a "third contact hole" according to one aspect of the invention. As previously described, the outputting line 99 is formed as the same film as the data line 6a (see FIG. 8 or 12), and the scanning line 11a is formed so as to contain the gate electrode 3a (see FIG. 8 or 12). The contact hole 811 passes through the Interlayer insulator 42, the insulator 61, and the interlayer insulator 41.

Forming the contact hole 811 in the same process of opening the contact hole 81 (see FIG. 8 or 12) can provide a simplified manufacturing process.

In addition, referring to FIGS. 10 to 12, the outputting line 99 is electrically connected to the scanning line 11b via a contact hole 812. The contact hole 817 is one example of a "fourth contact hole" according to one aspect of the invention.

As illustrated in FIGS. 11 and 12, according to the present embodiment, in particular, the contact hole 812 includes a first opening 812a opened in the same process of opening the contact hole 81 (see FIG. 12) and a second opening 812b opened in the same process of opening the contact hole 84. The first opening 812a and the second opening 812b overlap each other.

That is, first, as illustrated in FIG. 13A, the second opening 812b is formed by making an opening in the interlayer insulator 42, the insulator 61, and the interlayer insulator 41 in a region where the contact hole 812 is to be formed in the peripheral area around the image display region 10a in the same process of opening the contact hole 84. Then, as illustrated in FIG. 13B, the first opening 812a is formed by making an opening until the scanning line 11b is exposed through the inner bottom defining the second opening 812b (i.e., until the opening passes through the interlayer insulator 41, the insulator 2a, and the underlying insulator 12) in the same process of opening the contact hole 81. Then, as illustrated in FIG. 13C, the contact hole 812 is formed by depositing a conductive material from which the output line 99 (or data line 6a) is made, such as an aluminum-containing material, on the interior wall of each of the first opening 812a and the second opening 812b in the same process of forming the outputting line 99 (in other words, the process of forming the data line 6a). Therefore, the contact hole 812 can be formed by use of the process of opening the contact hole 81 for connecting the data line 6a and the semiconductor layer 1a and the process of opening the contact hole 811 for connecting the outputting line 99 and the scanning line 11b. In other words, there is no need to provide a dedicated mask for opening the contact hole 812 independently of a mask for opening each of the contact hole 81 and the contact hole 811. As a result, the manufacturing process can be simplified.

As described above, in accordance with the liquid crystal device according to the present embodiment, the on current in the pixel switching TFT 30 can be increased while at the same time a scan signal can be supplied to the TFT 30 reliably. Furthermore, the process of manufacturing the contact hole 812 for connecting the outputting line 99 of the scanning-line driving circuit 104 and the scanning line 11b can be simplified.

Electronic Apparatus

Figure 14:
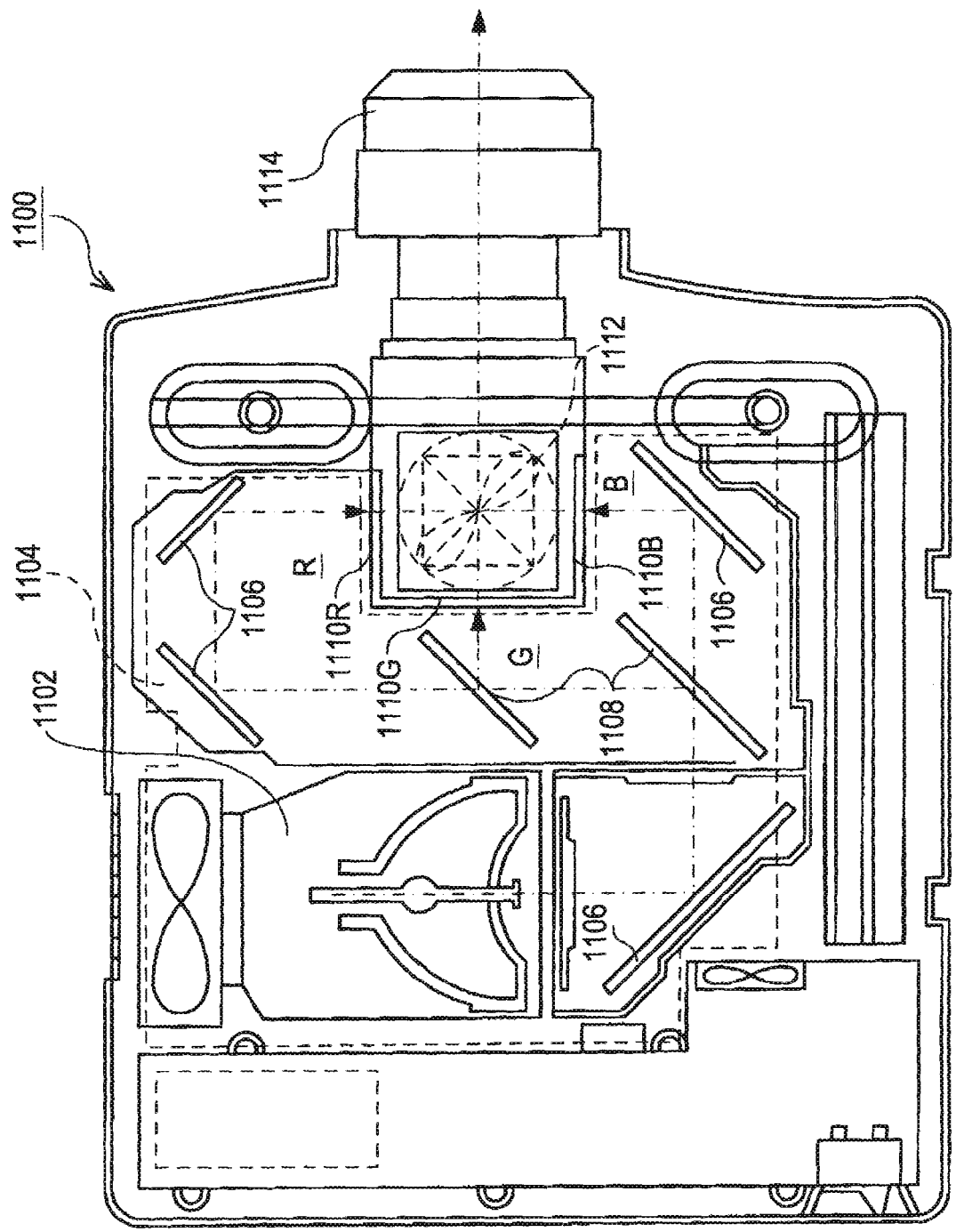
FIG. 14 is a plan view that illustrates a structure of a projector being one example of an electronic apparatus that uses an electro-optical device.

A liquid crystal device being the electro-optical device described above used in various electronic apparatuses will be described below. FIG. 14 is a plan view that illustrates an example of a structure of a projector. In the following description, a projector that uses the liquid crystal device as a light valve will be described.

As illustrated in FIG. 14, a lamp unit 1102 including a white light source, such as a halogen lamp, is Incorporated in a projector 1100. Projected light exiting from the lamp unit 1102 is divided into red, blue, and green primary colors by four mirrors 1106 and two dichroic mirrors 1108 arranged inside a light guide 1104. The divided light beams enter liquid crystal panels 1110R, 1110B, and 1110G, respectively, each functioning as a light valve for the corresponding primary color.

The structure of each of the liquid crystal panels 1110R, 1110B, and 1110G is approximately the same as that of the liquid crystal device described above. The liquid crystal panels 1110R, 1110B, and 1110G are driven by red, blue, and green primary-color signals supplied from an image signal processing circuit, respectively. The light beams modulated by these liquid crystal panels enter a dichroic prism 1112 from three directions. In the dichroic prism 1112, red and blue light beams are refracted by 90° and a blue light beam travels in a straight line. As a result of combining images for the colors, a color image is projected onto a screen or the like via a projection lens 1114.

For display images from the liquid crystal panels 1110R, 1110B, and 1110G, it is necessary that a display image from the liquid crystal panel 1110G be horizontally inverted from display images from the liquid crystal panels 1110R and 1110B.

There is no need to have a color filter because light beams corresponding to red, blue, and green enter the respective liquid crystal panels 1110R, 1110B, and 1110G by use of the dichroic mirrors 1108.

Examples of the electronic apparatus include, in addition to an electronic apparatus described with reference to FIG. 14, a mobile personal computer, a cellular phone, a liquid crystal television, a viewfinder or direct-view video recorder, a car navigation system, a pager, an electronic organizer, a personal digital assistant, a calculator, a word processor, a workstation, a videophone, a POS terminal, a device that includes a touch panel. It is obvious that the invention is applicable to these various electronic apparatuses.

The invention is also applicable to a reflective liquid crystal device in which an element is disposed on a silicon substrate (liquid crystal on silicon (LCOS)), a plasma display panel (PDP), a field emission display (FED), a surface-conduction electron-emitter display (SED), an organic electroluminescent display, a digital micromirror device (DMD), and an electrophoresis device, in addition to the liquid crystal device described in the embodiments.

The invention is not limited to the disclosed embodiments described above. Various modifications can be made without departing the scope and sprit of the claims and the specification. Electro-optical devices with such modifications and electronic apparatuses that include such an electro-optical device are included in the technical scope of the invention.

The entire disclosure of Japanese Patent Application No. 2006-190391, filed Jul. 11, 2006 is expressly incorporated by reference herein.

What is claimed is:

1. An electro-optical device comprising:
    a substrate;
    a pixel electrode;
    a transistor electrically connected to the pixel electrode and including (i) a semiconductor layer having a channel region, (ii) a first gate electrode above the semiconductor layer and overlapping the channel region, and (iii) a second gate electrode below the semiconductor layer and overlapping the channel region;
    a data line disposed above the first gate electrode and connected to the semiconductor layer via a first contact hole;
    a pixel-potential-side capacitor electrode electrically connected to the semiconductor layer and the pixel electrode and constituting a storage capacitor;
    a relay layer formed from the same film as the data line, connected to the pixel-potential-side capacitor electrode via a second contact hole, and electrically connected to the pixel electrode;
    a scanning-line driving circuit that supplies a scan signal to the first and second gate electrodes;
    an output line formed from the same film as the data line and allowing the scan signal from the scanning-line driving circuit to pass therethrough;
    a first scanning line formed from the same film as the first gate electrode and connected to the output line via a third contact hole, the third contact hole being opened in the same process of opening the first contact hole; and
    a second scanning line formed from the same film as the second gate electrode and connected to the output line via a fourth contact hole, the fourth contact hole including a first opening opened in the same process of opening the first contact hole and a second opening opened in the same process of opening the second contact hole, the first opening and the second opening overlapping each other,
    wherein the pixel electrode, the transistor, the data line, the pixel-potential-side capacitor electrode, the relay layer, the scanning-line driving circuit, the output line, the first scanning line, and the second scanning line are disposed above the substrate.

2. The electro-optical device according to claim 1, wherein the second scanning line includes a light-shielding conductive material.

3. The electro-optical device according to claim 1, wherein the semiconductor layer has a lightly-doped-drain (LDD) region, and wherein the second scanning line at least partially overlaps the LDD region.

4. The electro-optical device according to claim 3, wherein the second scanning line at least partially overlaps a source region and a drain region of the semiconductor layer.

5. The electro-optical device according to claim 1, wherein the first opening is formed inside the second opening in plan view from above the substrate after the second opening is formed.

6. An electronic apparatus including the electro-optical device according to claim 1.

7. A method of forming an electro-optical device comprising:

forming a pixel electrode on a substrate;

forming a transistor electrically connected to the pixel electrode and including (i) a semiconductor layer having a channel region, (ii) a first gate electrode above the semiconductor layer and overlapping the channel region, and (iii) a second gate electrode below the semiconductor layer and overlapping the channel region;

forming a data line above the first gate electrode and connecting the data line to the semiconductor layer via a first contact hole;

forming a pixel-potent-al-side capacitor electrode electrically connected to the semiconductor layer and the pixel electrode and constituting a storage capacitor;

forming a relay layer from the same film as the data line and electrically connecting the relay layer to the pixel-potential-side capacitor electrode via a second contact hole and to the pixel electrode;

forming a scanning-line driving circuit that supplies a scan signal to the first and second gate electrodes;

forming an output line from the same film as the data line and allowing the scan signal from the scanning-line driving circuit to pass therethrough;

forming a first scanning line from the same film as the first gate electrode and connecting the first scanning line to the output line via a third contact hole, the third contact hole being opened in the same process of opening the first contact hole; and forming a second scanning line from the same film as the second gate electrode and connecting the second scanning line to the output line via a fourth contact hole, the fourth contact hole including a first opening opened in the same process of opening the first contact hole and a second opening opened in the same process of opening the second contact hole, the first opening and the second opening overlapping each other.

* * * * *